United States Patent
Jiang et al.

(10) Patent No.: US 11,145,504 B2
(45) Date of Patent: Oct. 12, 2021

(54) METHOD OF FORMING FILM STACKS WITH REDUCED DEFECTS

(71) Applicant: Applied Materials, Inc., Santa Clara, CA (US)

(72) Inventors: Zhijun Jiang, Sunnyvale, CA (US); Ganesh Balasubramanian, Fremont, CA (US); Arkajit Roy Barman, Singapore (SG); Hidehiro Kojiri, Sunnyvale, CA (US); Xinhai Han, Santa Clara, CA (US); Deenesh Padhi, Sunnyvale, CA (US); Chuan Ying Wang, Sunnyvale, CA (US); Yue Chen, Sunnyvale, CA (US); Daemian Raj Benjamin Raj, Fremont, CA (US); Nikhil Sudhindrarao Jorapur, Sunnyvale, CA (US); Vu Ngoc Tran Nguyen, Santa Clara, CA (US); Miguel S. Fung, Sunnyvale, CA (US); Jose Angelo Olave, Angeles (PH); Thian Choi Lim, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 91 days.

(21) Appl. No.: 16/597,466

(22) Filed: Oct. 9, 2019

(65) Prior Publication Data
US 2020/0227258 A1     Jul. 16, 2020

Related U.S. Application Data

(60) Provisional application No. 62/791,996, filed on Jan. 14, 2019.

(51) Int. Cl.
*H01L 21/02* (2006.01)
*H01L 21/67* (2006.01)
(Continued)

(52) U.S. Cl.
CPC ........ *H01L 21/02274* (2013.01); *C23C 16/24* (2013.01); *C23C 16/402* (2013.01);
(Continued)

(58) Field of Classification Search
CPC ......... H01L 21/32137; H01L 21/02274; H01L 21/67213
See application file for complete search history.

(56) References Cited

U.S. PATENT DOCUMENTS

| 6,677,247 B2 | 1/2004 | Yuan et al. |
| 6,825,134 B2 | 11/2004 | Law et al. |

(Continued)

FOREIGN PATENT DOCUMENTS

KR     20030063989 A     7/2003

OTHER PUBLICATIONS

International Search Report and Written Opinion dated Feb. 5, 2020 for Application No. PCT/US2019/055895.

*Primary Examiner* — Zandra V Smith
*Assistant Examiner* — John M Parker
(74) *Attorney, Agent, or Firm* — Patterson + Sheridan LLP

(57) ABSTRACT

A method of forming a film stack with reduced defects is provided and includes positioning a substrate on a substrate support within a processing chamber and sequentially depositing polysilicon layers and silicon oxide layers to produce the film stack on the substrate. The method also includes supplying a current of greater than 5 ampere (A) to a plasma profile modulator while generating a deposition plasma within the processing chamber, exposing the substrate to the deposition plasma while depositing the polysilicon layers and the silicon oxide layers, and maintaining (Continued)

the processing chamber at a pressure of greater than 2 Torr to about 100 Torr while depositing the polysilicon layers and the silicon oxide layers.

18 Claims, 2 Drawing Sheets

(51) Int. Cl.
*C23C 16/44* (2006.01)
*C23C 16/24* (2006.01)
*C23C 16/40* (2006.01)

(52) U.S. Cl.
CPC ...... *C23C 16/4405* (2013.01); *C23C 16/4408* (2013.01); *H01L 21/022* (2013.01); *H01L 21/0262* (2013.01); *H01L 21/02164* (2013.01); *H01L 21/02532* (2013.01); *H01L 21/02595* (2013.01); *H01L 21/67213* (2013.01); *H01L 21/02216* (2013.01); *H01L 21/02573* (2013.01)

(56) References Cited

U.S. PATENT DOCUMENTS

| | | |
|---|---|---|
| 6,869,838 B2 | 3/2005 | Law et al. |
| 6,897,131 B2 | 5/2005 | Ramachandran et al. |
| 6,905,939 B2 | 6/2005 | Yuan et al. |
| 6,924,191 B2 | 8/2005 | Liu et al. |
| 7,132,338 B2 | 11/2006 | Samoilov et al. |
| 7,166,528 B2 | 1/2007 | Kim et al. |
| 7,429,540 B2 | 9/2008 | Olsen |
| 7,439,191 B2 | 10/2008 | Law et al. |
| 7,540,920 B2 | 6/2009 | Singh et al. |
| 7,648,927 B2 | 1/2010 | Singh et al. |
| 7,651,955 B2 | 1/2010 | Ranish et al. |
| 10,030,306 B2 | 7/2018 | Rajagopalan et al. |
| 2003/0008517 A1 | 1/2003 | Ko et al. |
| 2004/0018738 A1 | 1/2004 | Liu |
| 2006/0286774 A1 | 12/2006 | Singh et al. |
| 2008/0090425 A9 | 4/2008 | Olsen |
| 2010/0294199 A1 | 11/2010 | Tran et al. |
| 2010/0317177 A1 | 12/2010 | Huang et al. |
| 2012/0142172 A1 | 6/2012 | Fox et al. |
| 2016/0293609 A1 | 10/2016 | Jha et al. |
| 2017/0178923 A1* | 6/2017 | Surla ................. H01L 21/31116 |
| 2018/0258535 A1 | 9/2018 | Rajagopalan et al. |
| 2019/0131140 A1* | 5/2019 | Sun ................... H01L 21/31122 |

* cited by examiner

METHOD OF FORMING FILM STACKS WITH REDUCED DEFECTS

CROSS-REFERENCE TO RELATED APPLICATIONS

This application claims benefit to U.S. Appl. No. 62/791,996, filed on Jan. 14, 2019, which is herein incorporated by reference.

BACKGROUND

Field

Embodiments of the present disclosure generally relate to memory manufacturing processes, and more particularly, to methods of manufacturing 3D memory cells having a low dielectric constant and reduced resistivity.

Description of the Related Art

Growing demands continue to drive the need for high-capacity, high-performance computer memory devices with smaller geometries at lower costs. To this end, components of memory cells are stacked on top of each other to create three-dimensional (3D) memory cells, such as vertical gate 3D memory cells. One such technology is NAND flash memory, which is generally found in memory cards, USB flash drives, solid-state drives, and other similar devices for data storage and transfer. In NAND flash memory, memory cells made from transistors are connected in series and stacked in vertical layers to create densely-packed, high-capacity memory devices. Flash drives generally use less power and are more durable than ordinary hard drives because they do not contain moving parts. As such, there is great interest in increasing the capacity of flash drives, while reducing their size and cost.

As flash technology has progressed, limitations have continued to exist in how to create high-capacity devices on a small scale. For example, different materials that are combined on a microscopic scale have different physical properties that lead to non-uniformities in the flash memory device. Many vertical 3D memory cells include silicon oxide/polysilicon (OP) stacks and/or oxide/nitride (ON) stacks due to their integration properties. Problematically, however, during the deposition of the silicon oxide and polysilicon layers, contaminants often accumulate on the deposited layers and cause defects throughout the formed film stack or device. The contaminants are usually flakes or other particles derived from residual materials incidentally deposited on interior surfaces of the processing chamber, such as the faceplate.

Therefore, there is a need for improved methods of manufacturing memory structures, such as 3D memory cells, having no or a very low concentration of defects.

SUMMARY OF THE INVENTION

Embodiments described and discussed herein provide methods of forming film stacks, such as memory structures, with reduced defects. In one or more embodiments, the method of forming film stacks includes positioning a substrate on a substrate support within a processing chamber and sequentially depositing polysilicon layers and silicon oxide layers to produce the film stack on the substrate. The method also includes supplying a current of greater than 5 ampere (A) to a plasma profile modulator while generating a deposition plasma within the processing chamber, exposing the substrate to the deposition plasma while depositing the polysilicon layers and the silicon oxide layers, and maintaining the processing chamber at a pressure of greater than 2 Torr to about 100 Torr while depositing the polysilicon layers and the silicon oxide layers.

In some embodiments, the method of forming film stacks includes exposing a processing chamber to a conditioning plasma during a first conditioning process, where the processing chamber contains a faceplate disposed above a substrate support. The method also includes positioning a substrate on the substrate support within the processing chamber, moving the substrate support to an upper position separated from the faceplate by a narrow spacing, wherein the narrow spacing is about 50 mils to 1,000 mils, as measured between the substrate support and the faceplate, and sequentially depositing polysilicon layers and silicon oxide layers to produce a lower portion of the film stack on the substrate. The method further includes moving the substrate support containing the substrate to a lower position separated from the faceplate by a wide spacing, wherein the wide spacing is greater than 1,000 mils, as measured between the substrate support and the faceplate, maintaining a pressure of about 10 Torr to about 40 Torr within the processing chamber while moving the substrate support containing the substrate to the lower position, removing the substrate containing the lower portion of the film stack from the processing chamber, and exposing the processing chamber to the conditioning plasma during a second conditioning process. The method also includes positioning the substrate containing the lower portion of the film stack on the substrate support within the processing chamber, moving the substrate support to the upper position separated from the faceplate by the narrow spacing, and sequentially depositing the polysilicon layers and the silicon oxide layers to produce an upper portion of the film stack on the lower portion of the film stack within the processing chamber. The method further includes moving the substrate support to the lower position separated from the faceplate by the wide spacing, removing the substrate containing the upper portion of the film stack from the processing chamber, and exposing the processing chamber to the conditioning plasma during a third conditioning process.

In other embodiments, the method of forming film stacks includes exposing a processing chamber to a conditioning plasma at a power of about 100 watts to about 800 watts during a first conditioning process, positioning a substrate on a substrate support within the processing chamber, and sequentially depositing polysilicon layers and silicon oxide layers to produce a lower portion of the film stack on the substrate. The polysilicon layers and the silicon oxide layers are deposited by supplying a current of greater than 5 A to a plasma profile modulator while generating a deposition plasma within the processing chamber, exposing the substrate to the deposition plasma while depositing the polysilicon layers and the silicon oxide layers, and maintaining the processing chamber at a pressure of greater than 2 Torr to about 100 Torr while depositing the polysilicon layers and the silicon oxide layers. The method also includes removing the substrate containing the lower portion of the film stack from the processing chamber and exposing the processing chamber to the conditioning plasma at the power of about 100 watts to about 800 watts during a second conditioning process. The method further includes positioning the substrate containing the lower portion of the film stack on the substrate support within the processing chamber and sequentially depositing the polysilicon layers and the silicon oxide layers to produce an upper portion of the film stack on the lower portion of the film stack within the processing chamber. The polysilicon layers and the silicon oxide layers are deposited while supplying the current of greater than 5 A to the plasma profile modulator and generating the deposition plasma within the processing chamber, exposing the substrate to the deposition plasma while depositing the polysilicon layers and the silicon oxide layers, and maintaining the processing chamber at the pressure of greater than 2 Torr to about 100 Torr while depositing the polysilicon layers and the silicon oxide layers. The method includes removing the substrate containing the upper portion of the film stack from the processing chamber and exposing the processing chamber to the conditioning plasma at the power of about 100 watts to about 800 watts during a third conditioning process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described and discussed herein provide methods of forming film stacks, such as memory structures, with minimum or no defects. In one or more embodiments, the method of forming film stacks includes exposing a processing chamber to a conditioning plasma, a purge gas, and an evacuation during a first conditioning process, positioning a substrate on a substrate support within the processing chamber, and sequentially depositing polysilicon layers and silicon oxide layers to produce a lower portion of the film stack on the substrate. The polysilicon layers and the silicon oxide layers are deposited by supplying a current to a plasma profile modulator while generating a deposition plasma within the processing chamber, exposing the substrate to the deposition plasma while depositing the polysilicon layers and the silicon oxide layers.

The method also includes removing the substrate containing the lower portion of the film stack from the processing chamber and exposing the processing chamber to the conditioning plasma, the purge gas, and the evacuation during a second conditioning process. The method further includes positioning the substrate containing the lower portion of the film stack on the substrate support within the processing chamber and sequentially depositing the polysilicon layers and the silicon oxide layers to produce an upper portion of the film stack on the lower portion of the film stack within the processing chamber. The polysilicon layers and the silicon oxide layers are deposited while supplying the current to the plasma profile modulator and generating the deposition plasma within the processing chamber, exposing the substrate to the deposition plasma while depositing the polysilicon layers and the silicon oxide layers.

The method includes removing the substrate containing the upper portion of the film stack from the processing chamber and exposing the processing chamber to the conditioning plasma, the purge gas, and the evacuation during a third conditioning process. During the first, second, and/or third conditioning processes, the processing chamber is exposed to the conditioning plasma at a power of about 100 watts to about 800 watts for about 5 seconds to about 60 seconds. Also, during the first, second, and/or third conditioning processes, the processing chamber is at a pressure of about 5 Torr to about 50 Torr and is exposed to the purge gas having a flow rate of about 5 L/min to about 30 L/min.

Figure 1:
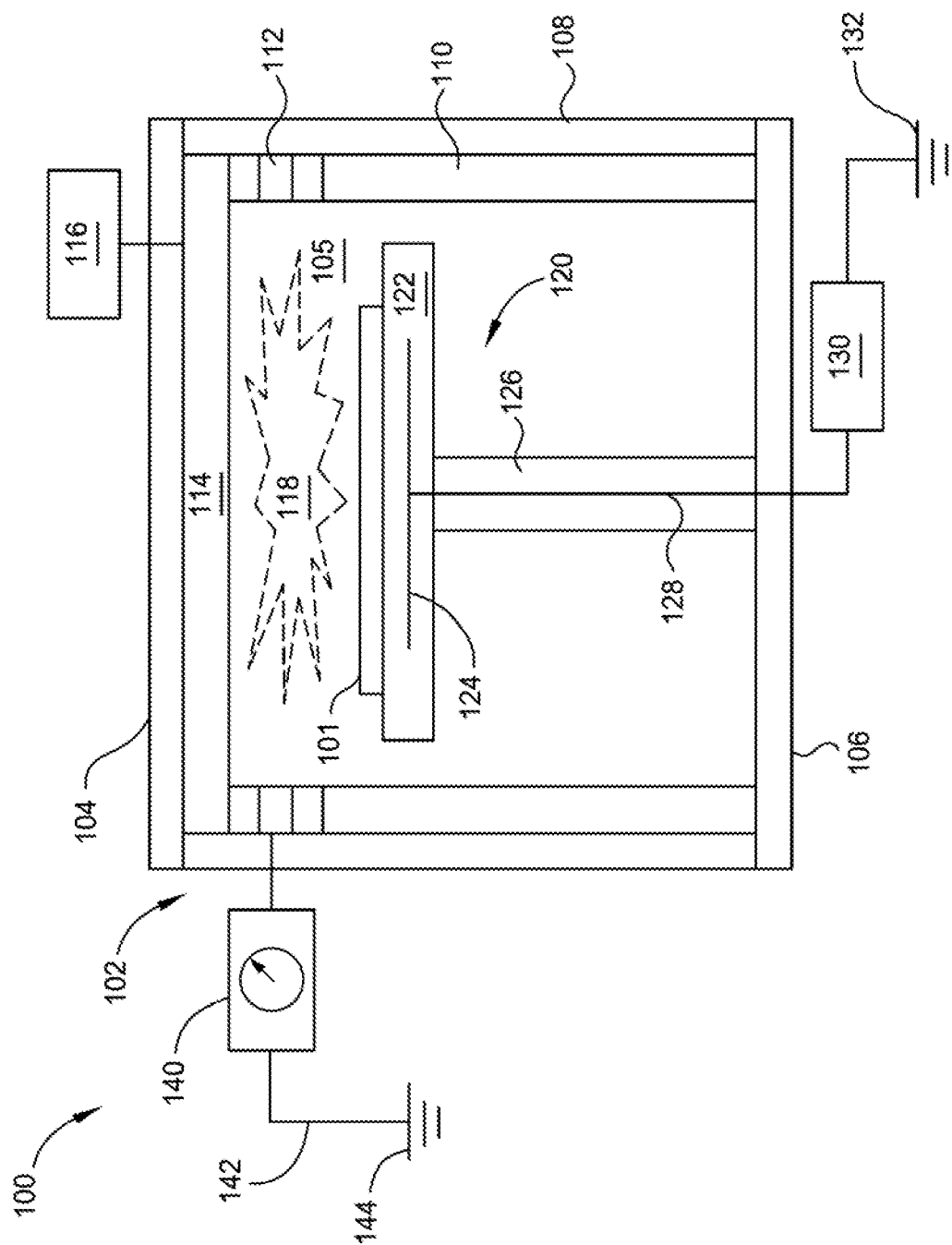
FIG. 1 depicts a cross-sectional view of a processing chamber that can be used during processes described and discussed herein, according to one or more embodiments.

FIG. 1 depicts a cross-sectional view of a processing system 100 containing a processing chamber 102 that is used during deposition and conditioning processes described and discussed herein, according to one or more embodiments. The deposition and conditioning processes form thin film stacks and devices with reduced defects. In one or more examples, the thin film stacks and devices can be or include silicon oxide/polysilicon (OP) stacks and/or oxide/nitride (ON) stacks which are utilized in vertical 3D memory cells.

The processing chamber 102 is a deposition chamber, such as a plasma-enhanced chemical vapor deposition (PECVD) chamber, and can be used to deposit various types of material, annealing (plasma and/or thermal annealing), substrate cleaning, and for performing other processing techniques. The processing chamber 102 includes a lid 104, a bottom 106, and one, two, three, four, or more sides or walls 108. Each wall 108 can include a thermally and electrically insulative liner or ring 110 and an electrically conductive liner or ring 112. The thermally and electrically insulative liner 110 contains one or more thermally and electrically insulative materials, such as ceramic, quartz, silica, alumina, or any combination thereof. The electrically conductive ring 112 contains one or more electrically conductive materials or metals, such as aluminum, steel, stainless steel, alloys thereof, or any combination thereof.

The processing chamber 102 also includes a showerhead 114 and a pedestal or substrate support assembly 120 disposed therein. A process region 105 is located between and adjacent the showerhead 114 and the substrate support assembly 120. A substrate 101 is positioned or otherwise disposed on the substrate support assembly 120 within the process region 105. The showerhead 114 is connected to a plasma power supply 116, such as an RF generator, to generate plasma 118 within the process region 105. The substrate support assembly 120 contains a substrate support 122, a heater 124 contained inside the substrate support 122, and a shaft 126 coupled to the substrate support 122. In one or more configurations, as depicted in FIG. 1, the electrically conductive ring 112 is disposed between the substrate support 122 and the showerhead 114. One or more electrodes 128 are coupled to and in electrical communication between the substrate support 122 and an RF filter 130 and a ground 132. The substrate support 122, the electrode 128, the RF filter 130, and the ground 132 provide a first plasma outlet for the plasma 118 generated in the process region 105.

The processing system 100 also contains a plasma profile modulator (PPM) 140 coupled to and in electrical communication with the processing chamber 102 via the electrically conductive ring 112. The PPM 140 can be modulated or otherwise adjusted to provide a desired plasma profile including shape and location within the process region 105 and on the substrate 101. One or more electrodes 142 are coupled to and in electrical communication between the electrically conductive ring 112, the PPM 140, and a ground 144. The electrically conductive ring 112, the electrode 142, the PPM 140, and the ground 144 provide a second plasma outlet for the plasma 118 generated in the process region 105. A processing system similar to the processing system 100, the processing chamber 102, the PPM 140, and components thereof is the Precision™ PECVD chamber commercially available from Applied Materials, Inc. A plasma profile modulator similar to the PPM 140 is commercially available from Comet Plasma Control Technologies.

Figure 2:
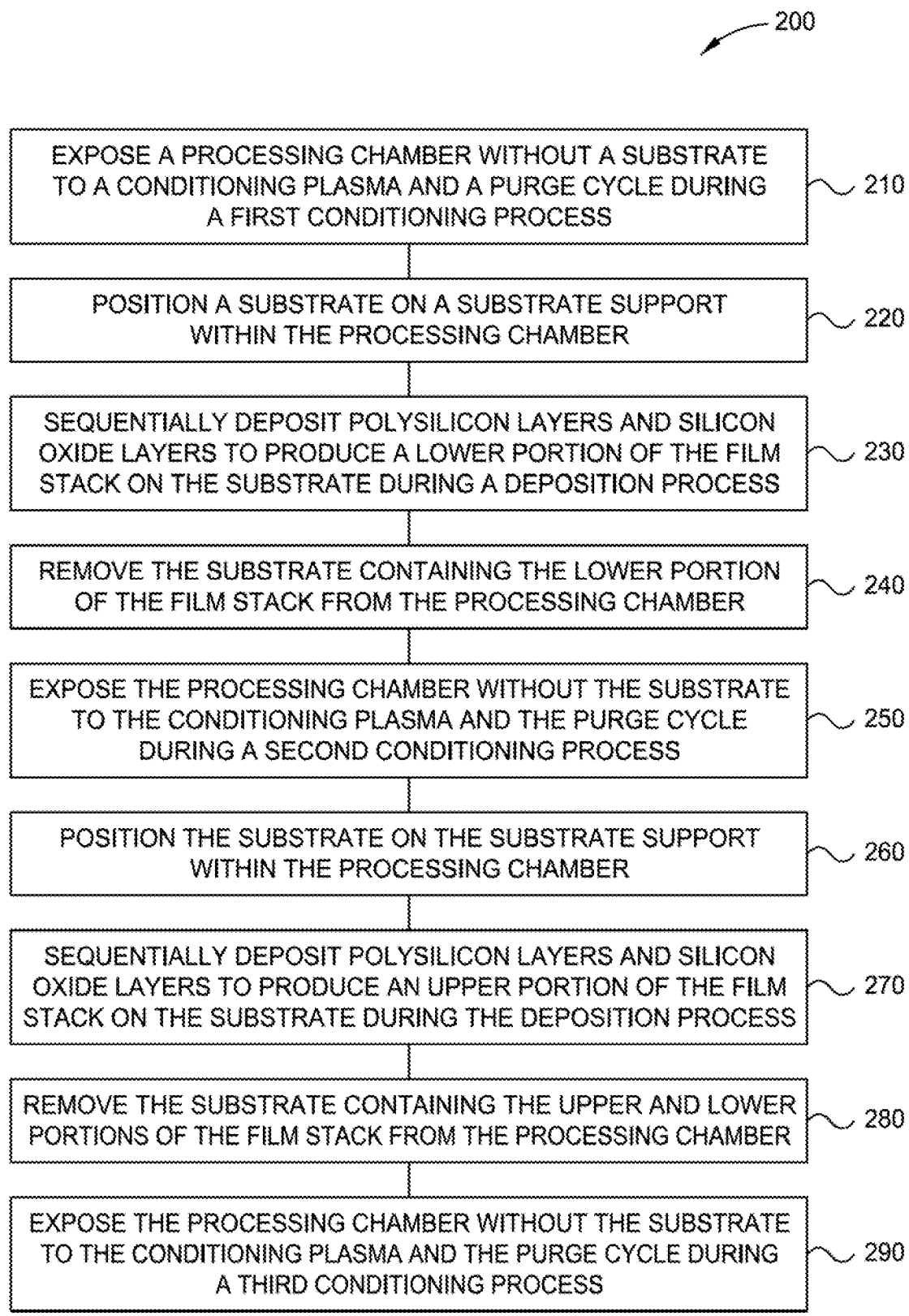
FIG. 2 is a flow chart of a method of forming a film stack with reduced defects, according to one or more embodiments.

FIG. 2 is a flow chart of a method 200 of forming film stacks, such as memory structures, with minimum or no defects, according to one or more embodiments. The method 200 includes processes for treating or conditioning a processing chamber and processes for depositing materials to form a film stack. The materials deposited include polysilicon layers and silicon oxide layers which are sequentially deposited to produce lower and upper portions of the film stack. The method 200 is described and discussed in brief detail as follows.

At 210, an empty processing chamber (e.g., chamber not containing a substrate) is exposed to a conditioning plasma and a purge cycle during a first conditioning process.

At 220, a substrate is positioned or otherwise disposed on a substrate support within the processing chamber.

At 230, the polysilicon layers and silicon oxide layers are sequentially deposited to produce a lower portion of the film stack on the substrate during a deposition process.

At 240, the substrate containing the lower portion of the film stack is withdrawn or otherwise removed from the processing chamber.

At 250, the empty processing chamber is exposed to the conditioning plasma and the purge cycle during a second conditioning process.

At 260, the substrate is positioned or otherwise disposed on the substrate support within the processing chamber.

At 270, the polysilicon layers and silicon oxide layers are sequentially deposited to produce an upper portion of the film stack on the substrate during the deposition process. The upper portion of the film stack is deposited or otherwise formed on the lower portion of the film stack.

At 280, the substrate containing the upper and lower portions of the film stack is withdrawn or otherwise removed from the processing chamber.

At 290, the empty processing chamber is exposed to the conditioning plasma and the purge cycle during a third conditioning process.

In one or more embodiments, a method of forming a film stack with reduced defects is provided and includes exposing a processing chamber to a conditioning plasma at a power of about 100 watts to about 800 watts during a first conditioning process at 210, positioning a substrate on a substrate support within the processing chamber at 220, and sequentially depositing polysilicon layers and silicon oxide layers to produce a lower portion of the film stack on the substrate at 230. The polysilicon layers and the silicon oxide layers are deposited by supplying a current of greater than 5 A to a plasma profile modulator while generating a deposition plasma within the processing chamber, exposing the substrate to the deposition plasma while depositing the polysilicon layers and the silicon oxide layers, and maintaining the processing chamber at pressure of greater than 2 Torr to about 100 Torr while depositing the polysilicon layers and the silicon oxide layers. The method also includes removing the substrate containing the lower portion of the film stack from the processing chamber at 240 and exposing the processing chamber to the conditioning plasma at the power of about 100 watts to about 800 watts during a second conditioning process at 250. The method further includes positioning the substrate containing the lower portion of the film stack on the substrate support within the processing chamber at 260 and sequentially depositing the polysilicon layers and the silicon oxide layers to produce an upper portion of the film stack on the lower portion of the film stack within the processing chamber at 270. The polysilicon layers and the silicon oxide layers are deposited by supplying the current of greater than 5 A to the plasma profile modulator while generating the deposition plasma within the processing chamber, exposing the substrate to the deposition plasma while depositing the polysilicon layers and the silicon oxide layers, and maintaining the processing chamber at the pressure of greater than 2 Torr to about 100 Torr while depositing the polysilicon layers and the silicon oxide layers. The method includes removing the substrate containing the upper portion of the film stack from the processing chamber at 280 and exposing the processing chamber to the conditioning plasma at the power of about 100 watts to about 800 watts during a third conditioning process at 290.

The method 200 is described and discussed with additional details as follows.

At 210, the processing chamber does not contain a substrate and the faceplate and other interior surfaces of the processing chamber typically contain residual materials deposited thereon. These residual materials can peel and break from the surfaces and end up causing flakes, particles, and other contaminants in the processing chamber that eventually contaminate the substrate surface causing defects to the film stack or corresponding device. The processing chamber contains the faceplate disposed above the substrate support. The empty substrate support (not containing a substrate) can be moved away from the faceplate to a lower position separated from the faceplate by a distance of a wide spacing. In some examples, the wide spacing is greater than 1,000 mils, such as about 2,000 mils to about 10,000 mils or about 3,000 mils to about 5,000 mils, as measured between the substrate support and the faceplate.

In one or more embodiments, the wide spacing between the substrate support and the faceplate during any of the conditioning processes is greater than 1,000 mils, such as about 1,500 mils, about 2,000 mils, about 2,500 mils, about 3,000 mils, about 3,500 mils, or about 4,000 mils to about 5,000 mils, about 6,000 mils, about 7,000 mils, about 8,000 mils, about 9,000 mils, about 10,000 mils, about 12,000 mils, or greater. For example, the wide spacing between the substrate support and the faceplate during the conditioning process is greater than 1,000 mils to about 12,000 mils, greater than 1,000 mils to about 10,000 mils, greater than 1,000 mils to about 8,000 mils, greater than 1,000 mils to about 6,000 mils, greater than 1,000 mils to about 5,000 mils, greater than 1,000 mils to about 4,000 mils, about 2,000 mils to about 12,000 mils, about 2,000 mils to about 10,000 mils, about 2,000 mils to about 8,000 mils, about 2,000 mils to about 6,000 mils, about 2,000 mils to about 5,000 mils, about 2,000 mils to about 4,000 mils, about 3,000 mils to about 12,000 mils, about 3,000 mils to about 10,000 mils, about 3,000 mils to about 8,000 mils, about 3,000 mils to about 6,000 mils, about 3,000 mils to about 5,000 mils, or about 3,000 mils to about 4,000 mils.

The processing chamber is exposed to a first conditioning process in order to clean and season the processing chamber.

The first conditioning process can be or include cleaning and seasoning processes. The processing chamber is exposed to a conditioning plasma and a purge cycle during the first conditioning process. The purge cycle includes exposing the processing chamber to a purge gas under relatively high pressure and evacuating the processing chamber.

In one or more examples, during the first conditioning process, the processing chamber is exposed to the conditioning plasma at a power of about 100 watts to about 800 watts for about 5 seconds to about 60 seconds, about 10 seconds to about 45 seconds, or about 15 seconds to about 30 seconds. Also, during the first conditioning process, the processing chamber is at a pressure of about 5 Torr to about 50 Torr and exposed to the purge gas having a flow rate of about 5 L/min to about 30 L/min. The purge gas is or contains nitrogen, argon, helium, or any combination thereof.

The conditioning plasma is at a power of about 100 watts, about 200 watts, about 300 watts, or about 400 watts to about 500 watts, about 600 watts, about 700 watts, about 800 watts, about 900 watts, or about 1,000 watts during any of the conditioning processes. For example the conditioning plasma is at a power of about 100 watts to about 1,000 watts, about 100 watts to about 800 watts, about 100 watts to about 600 watts, about 100 watts to about 500 watts, about 100 watts to about 300 watts, about 250 watts to about 1,000 watts, about 250 watts to about 800 watts, about 250 watts to about 600 watts, about 250 watts to about 500 watts, about 250 watts to about 300 watts, about 400 watts to about 1,000 watts, about 400 watts to about 800 watts, about 400 watts to about 600 watts, or about 400 watts to about 500 watts during any of the conditioning processes.

The processing chamber is at a pressure of about 5 Torr, about 10 Torr, about 15 Torr, or about 20 Torr to about 25 Torr, about 30 Torr, about 40 Torr, about 50 Torr, about 70 Torr, or about 100 Torr during any of the conditioning processes. For example, the processing chamber is at a pressure of about 5 Torr to about 100 Torr, about 5 Torr to about 80 Torr, about 5 Torr to about 60 Torr, about 5 Torr to about 50 Torr, about 5 Torr to about 40 Torr, about 5 Torr to about 25 Torr, about 5 Torr to about 15 Torr, about 5 Torr to about 10 Torr, about 10 Torr to about 100 Torr, about 10 Torr to about 80 Torr, about 10 Torr to about 60 Torr, about 10 Torr to about 50 Torr, about 10 Torr to about 40 Torr, about 10 Torr to about 25 Torr, about 20 Torr to about 100 Torr, about 20 Torr to about 80 Torr, about 20 Torr to about 60 Torr, about 20 Torr to about 50 Torr, about 20 Torr to about 40 Torr, or about 20 Torr to about 30 Torr during any of the conditioning processes.

The processing chamber is exposed to the purge gas having a flow rate of about 3 L/min, about 5 L/min, about 6 L/min, about 8 L/min, about 10 L/min, about 12 L/min, or about 15 L/min to about 18 L/min, about 20 L/min, about 22 L/min, about 25 L/min, about 28 L/min, about 30 L/min, about 40 L/min, or about 50 L/min during any of the conditioning processes. In some examples, the processing chamber is exposed to the purge gas having a flow rate of about 3 L/min to about 50 L/min, about 5 L/min to about 50 L/min, about 5 L/min to about 40 L/min, about 5 L/min to about 30 L/min, about 5 L/min to about 25 L/min, about 5 L/min to about 20 L/min, about 5 L/min to about 15 L/min, about 5 L/min to about 10 L/min, about 10 L/min to about 50 L/min, about 10 L/min to about 40 L/min, about 10 L/min to about 30 L/min, about 10 L/min to about 25 L/min, about 10 L/min to about 20 L/min, about 10 L/min to about 15 L/min, about 15 L/min to about 50 L/min, about 15 L/min to about 40 L/min, about 15 L/min to about 30 L/min, about 15 L/min to about 25 L/min, or about 15 L/min to about 20 L/min during any of the conditioning processes.

At 220, a substrate is positioned, placed, or otherwise disposed on a substrate support within the processing chamber. The substrate can be heated to the desired process temperature by heaters on the substrate support. The substrate support containing the substrate can be moved towards the faceplate to an upper position separated from the faceplate by a distance of a narrow spacing. In some examples, the narrow spacing is about 50 mils to 1,000 mils, about 100 mils to 500 mils, or about 150 mils to 350 mils, as measured between the substrate support and the faceplate.

The narrow spacing between the substrate support and the faceplate during the deposition process (e.g., depositing the polysilicon layers and the silicon oxide layers) is about 50 mils, about 100 mils, about 150 mils, about 200 mils, or about 250 mils to about 300 mils, about 350 mils, about 400 mils, about 450 mils, about 500 mils, about 600 mils, about 800 mils, or 1,000 mils. For example, the narrow spacing between the substrate support and the faceplate during the deposition process is about 50 mils to 1,000 mils, about 50 mils to about 800 mils, about 50 mils to about 600 mils, about 50 mils to about 500 mils, about 50 mils to about 400 mils, about 100 mils to 1,000 mils, about 100 mils to about 800 mils, about 100 mils to about 600 mils, about 100 mils to about 500 mils, about 100 mils to about 400 mils, about 200 mils to 1,000 mils, about 200 mils to about 800 mils, about 200 mils to about 600 mils, about 200 mils to about 500 mils, about 200 mils to about 400 mils, about 200 mils to about 300 mils, about 200 mils to about 250 mils, or about 250 mils to about 350 mils.

At 230, the polysilicon layers and silicon oxide layers are sequentially deposited to produce a lower portion of the film stack on the substrate during one or more deposition processes, such as a PE-CVD process and/or a thermal CVD process. The substrate support is at a narrow spacing from the faceplate during the deposition process. The polysilicon layers can be doped and generally contain a p-type doped-polysilicon or an n-type doped-polysilicon. For the p-type doped-polysilicon, the polysilicon layers contain phosphorus, nitrogen, arsenic, or any combination thereof. In one or more examples, the polysilicon layer contains phosphorus doped-polysilicon.

In one or more embodiments, the polysilicon layers are deposited, formed, or otherwise produced by exposing the substrate to a deposition gas containing one or more silicon precursors, one or more phosphorus precursors, and one or more carrier gases during a PE-CVD process. In some examples, the silicon precursor contains silane, the phosphorus precursor contains phosphine, and the carrier gas contains argon, helium, neon, or any combination thereof.

In other embodiments, the silicon oxide layers are deposited, formed, or otherwise produced by exposing the substrate to a deposition gas containing one or more silicon precursors, one or more oxygen precursors, and one or more carrier gases during a PE-CVD process. In some examples, the silicon precursor contains tetraethyl orthosilicate, the oxygen precursor contains nitrous oxide, oxygen, ozone, water, or any combination thereof, and the carrier gas contains argon, helium, neon, or any combination thereof.

The processing chamber is maintained or pressurized to a pressure of greater than 2 Torr, such as about 3 Torr, about 4 Torr, about 5 Torr, about 8 Torr, or about 10 Torr to about 12 Torr, about 15 Torr, about 20 Torr, about 30 Torr, about 50 Torr, about 75 Torr, about 85 Torr, about 100 Torr, or about 120 Torr during the deposition process while depositing materials, such as the polysilicon layers and the silicon oxide layers. In one or more examples, the processing chamber is maintained or pressurized to a pressure of greater than 2 Torr to about 120 Torr, greater than 2 Torr to about 100 Torr, greater than 2 Torr to about 80 Torr, greater than 2 Torr to about 60 Torr, greater than 2 Torr to about 50 Torr, greater than 2 Torr to about 40 Torr, greater than 2 Torr to about 30 Torr, greater than 2 Torr to about 20 Torr, greater than 2 Torr to about 10 Torr, about 3 Torr to about 120 Torr, about 3 Torr to about 100 Torr, about 3 Torr to about 80 Torr, about 3 Torr to about 60 Torr, about 3 Torr to about 50 Torr, about 3 Torr to about 40 Torr, about 3 Torr to about 30 Torr, about 3 Torr to about 20 Torr, about 3 Torr to about 10 Torr, about 4 Torr to about 120 Torr, about 4 Torr to about 100 Torr, about 4 Torr to about 80 Torr, about 4 Torr to about 60 Torr, about 4 Torr to about 50 Torr, about 4 Torr to about 40 Torr, about 4 Torr to about 30 Torr, about 4 Torr to about 20 Torr, or about 4 Torr to about 10 Torr while depositing materials during the deposition process.

The substrate is heated to a temperature of about 400° C., about 425° C., about 450° C., about 475° C., or about 500° C. to about 525° C., about 550° C., about 575° C., about 600° C., about 625° C., about 650° C., or about 700° C. during the deposition process while depositing materials, such as the polysilicon layers and the silicon oxide layers. For example, the substrate is heated to a temperature of about 400° C. to about 700° C., about 425° C. to about 700° C., about 450° C. to about 700° C., about 475° C. to about 700° C., about 500° C. to about 700° C., about 550° C. to about 700° C., about 600° C. to about 700° C., about 400° C. to about 650° C., about 425° C. to about 650° C., about 450° C. to about 650° C., about 475° C. to about 650° C., about 500° C. to about 650° C., about 550° C. to about 650° C., about 600° C. to about 650° C., about 400° C. to about 600° C., about 425° C. to about 600° C., about 450° C. to about 600° C., about 475° C. to about 600° C., about 500° C. to about 600° C., about 550° C. to about 600° C. while depositing materials during the deposition process.

In one or more examples, a process gas is ignited to generate the deposition plasma used in the PE-CVD process. The process gas can be or include argon, helium, neon, silane, or any combination thereof. The process gas is introduced or flowed into the processing chamber at a rate of greater than 2 L/min, such as about 2.5 L/min, about 3 L/min, about 3.5 L/min, about 4 L/min, or about 5 L/min to about 6 L/min, about 7 L/min, about 8 L/min, about 9 L/min, about 10 L/min, about 12 L/min, or greater. In one or more examples, the process gas is introduced or flowed into the processing chamber at a rate of greater than 2 L/min to about 12 L/min, greater than 2 L/min to about 10 L/min, greater than 2 L/min to about 8 L/min, greater than 2 L/min to about 6 L/min, greater than 2 L/min to about 5 L/min, about 3 L/min to about 12 L/min, about 3 L/min to about 10 L/min, about 3 L/min to about 8 L/min, about 3 L/min to about 6 L/min, about 3 L/min to about 5 L/min, about 5 L/min to about 12 L/min, about 5 L/min to about 10 L/min, about 5 L/min to about 8 L/min, or about 5 L/min to about 6 L/min.

The deposition plasma is at a power of about 200 watts, about 250 watts, about 300 watts, about 400 watts, or about 500 watts to about 600 watts, about 800 watts, about 1,000 watts, about 1,500 watts, about 2,000 watts, about 2,500 watts, about 3,000 watts, or greater during the deposition process (e.g., depositing the polysilicon layers and the silicon oxide layers). In one or more examples, the deposition plasma is at a power of about 200 watts to about 3,000 watts, about 200 watts to about 2,500 watts, about 200 watts to about 2,000 watts, about 200 watts to about 1,500 watts, about 200 watts to about 1,000 watts, about 200 watts to about 800 watts, about 200 watts to about 500 watts, about 250 watts to about 3,000 watts, about 250 watts to about 2,500 watts, about 250 watts to about 2,000 watts, about 250 watts to about 1,500 watts, about 250 watts to about 1,000 watts, about 250 watts to about 800 watts, about 250 watts to about 500 watts, about 500 watts to about 3,000 watts, about 500 watts to about 2,500 watts, about 500 watts to about 2,000 watts, about 500 watts to about 1,500 watts, about 500 watts to about 1,000 watts, or about 500 watts to about 800 watts.

A current is supplied to the PPM while generating a deposition plasma within the processing chamber. The current can be modulated or otherwise adjusted while generating the deposition plasma and depositing materials, such as the polysilicon layers and the silicon oxide layers. In one or more embodiments, a current of greater than 2.5 ampere (A), greater than 3 A, greater than 4 A, or greater than 5 A is supplied to the PPM while generating the deposition plasma. In some examples, the current is greater than 5 A, about 5.5 A, about 6 A, about 7 A, about 8 A, about 9 A, or about 10 A to about 12 A, about 14 A, about 15 A, about 18 A, or about 20 A. For example, the current is greater than 5 A to about 20 A, greater than 5 A to about 18 A, greater than 5 A to about 15 A, greater than 5 A to about 12 A, greater than 5 A to about 10 A, greater than 5 A to about 8 A, about 6 A to about 20 A, about 6 A to about 18 A, about 6 A to about 15 A, about 6 A to about 12 A, about 6 A to about 10 A, about 6 A to about 8 A, about 7 A to about 20 A, about 7 A to about 18 A, about 7 A to about 15 A, about 7 A to about 12 A, about 7 A to about 10 A, about 8 A to about 20 A, about 8 A to about 18 A, about 8 A to about 15 A, about 8 A to about 12 A, about 8 A to about 10 A, about 9 A to about 20 A, about 9 A to about 18 A, about 9 A to about 15 A, about 9 A to about 12 A, or about 9 A to about 10 A.

At 240, the substrate support containing the substrate having the lower portion of the film stack is moved away from the faceplate to a distance of a wide spacing of greater than 1,000 mils, as measured between the substrate support and the faceplate. The processing chamber is maintained at a pressure of about 3 Torr to about 50 Torr while moving the substrate support containing the substrate to the lower position. The high pressure prevents or reduces the amount of particles and/or other contaminants from collecting or otherwise depositing on the upper surface of the substrate while moving the substrate support to the lower position. Once in the lower position and the processing chamber is purged, the substrate is withdrawn or otherwise removed from the processing chamber.

The processing chamber is maintained at a pressure of about 3 Torr, about 5 Torr, about 8 Torr, about 10 Torr, about 12 Torr, about 15 Torr, about 18 Torr, about 20 Torr, or about 22 Torr to about 25 Torr, about 28 Torr, about 30 Torr, about 35 Torr, about 40 Torr, about 45 Torr, or about 50 Torr while moving the substrate support containing the substrate to the lower position. For example, the processing chamber is maintained at a pressure of about 3 Torr to about 50 Torr, about 5 Torr to about 50 Torr, about 10 Torr to about 50 Torr, about 15 Torr to about 50 Torr, about 18 Torr to about 50 Torr, about 20 Torr to about 50 Torr, about 22 Torr to about 50 Torr, about 25 Torr to about 50 Torr, about 28 Torr to about 50 Torr, about 30 Torr to about 50 Torr, about 35 Torr to about 50 Torr, about 40 Torr to about 50 Torr, about 3 Torr to about 40 Torr, about 5 Torr to about 40 Torr, about 10 Torr to about 40 Torr, about 15 Torr to about 40 Torr, about 18 Torr to about 40 Torr, about 20 Torr to about 40 Torr, about 22 Torr to about 40 Torr, about 25 Torr to about 40 Torr, about 28 Torr to about 40 Torr, about 30 Torr to about 40

Torr, about 35 Torr to about 40 Torr, about 3 Torr to about 30 Torr, about 5 Torr to about 30 Torr, about 10 Torr to about 30 Torr, about 15 Torr to about 30 Torr, about 18 Torr to about 30 Torr, about 20 Torr to about 30 Torr, about 22 Torr to about 30 Torr, about 25 Torr to about 30 Torr, or about 28 Torr to about 30 Torr while moving the substrate support containing the substrate to the lower position.

In one or more examples, the wide spacing is about 2,000 mils to about 10,000 mils and the processing chamber is maintained at a pressure of about 10 Torr to about 40 Torr while moving the substrate support containing the substrate to the lower position. In some examples, the wide spacing is about 3,000 mils to about 5,000 mils and the processing chamber is maintained at a pressure of about 15 Torr to about 35 Torr while moving the substrate support containing the substrate to the lower position. In other examples, the wide spacing is about 3,500 mils to about 4,500 mils and the processing chamber is maintained at a pressure of about 20 Torr to about 30 Torr while moving the substrate support containing the substrate to the lower position.

At 250, the empty processing chamber is exposed to the conditioning plasma and the purge cycle during a second conditioning process. The substrate support is at a narrow spacing from the faceplate during the second conditioning process.

The processing chamber is exposed to the second conditioning process in order to clean and season the processing chamber. The second conditioning process can be or include cleaning and seasoning processes. The processing chamber is exposed to a conditioning plasma and a purge cycle during the second conditioning process. The purge cycle includes exposing the processing chamber to a purge gas under relatively high pressure and evacuating the processing chamber.

During the second conditioning process, the processing chamber is exposed to the conditioning plasma at a power of about 100 watts to about 800 watts for about 5 seconds to about 60 seconds, about 10 seconds to about 45 seconds, or about 15 seconds to about 30 seconds. Also, during the second conditioning process, the processing chamber is at a pressure of about 5 Torr to about 50 Torr and exposed to the purge gas having a flow rate of about 5 L/min to about 30 L/min. The purge gas is or contains nitrogen, argon, helium, or any combination thereof.

At 260, the substrate is positioned, placed, or otherwise disposed on the substrate support within the processing chamber. The substrate can be heated to the desired process temperature by heaters on the substrate support. The substrate support containing the substrate can be moved towards the faceplate to a distance of a narrow spacing. In some examples, the narrow spacing is about 50 mils to 1,000 mils, about 100 mils to 500 mils, or about 150 mils to 350 mils, as measured between the substrate support and the faceplate.

At 270, the polysilicon layers and silicon oxide layers are sequentially deposited to produce an upper portion of the film stack on the substrate during one or more deposition processes, such as a PE-CVD process and/or a thermal CVD process. The upper portion of the film stack is deposited or otherwise formed on the lower portion of the film stack. The substrate support is at a narrow spacing from the faceplate during the deposition process. The polysilicon layers can be doped and generally contain a p-type doped-polysilicon or an n-type doped-polysilicon. For the p-type doped-polysilicon, the polysilicon layers contain phosphorus, nitrogen, arsenic, or any combination thereof. In one or more examples, the polysilicon layer contains phosphorus doped-polysilicon. The polysilicon layers and silicon oxide layers can be deposited in the same manner and process for the upper portion of the film stack as for the lower portion of the film stack.

At 280, the substrate containing the upper and lower portions of the film stack is moved away from the faceplate to a distance of a wide spacing of greater than 1,000 mils, as measured between the substrate support and the faceplate. The processing chamber is maintained at a pressure of about 3 Torr to about 50 Torr while moving the substrate support containing the substrate to the lower position. The process at 280 can be similar or the same as the process at 240. The high pressure prevents or reduces the amount of particles and/or other contaminants from collecting or otherwise depositing on the upper surface of the substrate while moving the substrate support to the lower position. Once in the lower position and the processing chamber is purged, the substrate is withdrawn or otherwise removed from the processing chamber.

In one or more examples, the wide spacing is about 2,000 mils to about 10,000 mils and the processing chamber is maintained at a pressure of about 10 Torr to about 40 Torr while moving the substrate support containing the substrate to the lower position. In some examples, the wide spacing is about 3,000 mils to about 5,000 mils and the processing chamber is maintained at a pressure of about 15 Torr to about 35 Torr while moving the substrate support containing the substrate to the lower position. In other examples, the wide spacing is about 3,500 mils to about 4,500 mils and the processing chamber is maintained at a pressure of about 20 Torr to about 30 Torr while moving the substrate support containing the substrate to the lower position.

At 290, the empty processing chamber is exposed to the conditioning plasma and the purge cycle during a third conditioning process. The substrate support is at a narrow spacing from the faceplate during the third conditioning process.

The processing chamber is exposed to the third conditioning process in order to clean and season the processing chamber. The third conditioning process can be or include cleaning and seasoning processes. The processing chamber is exposed to a conditioning plasma and a purge cycle during the third conditioning process. The purge cycle includes exposing the processing chamber to a purge gas under relatively high pressure and evacuating the processing chamber.

During the third conditioning process, the processing chamber is exposed to the conditioning plasma at a power of about 100 watts to about 800 watts for about 5 seconds to about 60 seconds, about 10 seconds to about 45 seconds, or about 15 seconds to about 30 seconds. Also, during the third conditioning process, the processing chamber is at a pressure of about 5 Torr to about 50 Torr and exposed to the purge gas having a flow rate of about 5 L/min to about 30 L/min. The purge gas is or contains nitrogen, argon, helium, or any combination thereof.

Each of the lower portion and upper portion of the film stack independently contains about 10 pairs, about 15 pairs, about 20 pairs, about 25 pairs, or about 30 pairs to about 35 pairs, about 40 pairs, about 45 pairs, about 50 pairs, or about 60 pairs of the polysilicon layer and the silicon oxide layer. In some examples, each of the lower portion and upper portion of the film stack independently contains about 10 pairs to about 60 pairs, about 15 pairs to about 50 pairs, or about 20 pairs to about 40 pairs of the polysilicon layer and the silicon oxide layer.

The film stack contains about 30 pairs, about 40 pairs, about 50 pairs, or about 60 pairs to about 70 pairs, about 80 pairs, about 90 pairs, about 100 pairs, or about 120 pairs of the polysilicon layer and the silicon oxide layer. In one or more examples, the film stack contains about 30 pairs to about 120 pairs, about 40 pairs to about 120 pairs, about 50 pairs to about 120 pairs, about 70 pairs to about 120 pairs, about 85 pairs to about 120 pairs, about 100 pairs to about 120 pairs, about 30 pairs to about 100 pairs, about 40 pairs to about 100 pairs, about 50 pairs to about 100 pairs, about 70 pairs to about 100 pairs, about 85 pairs to about 100 pairs, about 30 pairs to about 80 pairs, about 40 pairs to about 80 pairs, about 50 pairs to about 80 pairs, about 70 pairs to about 80 pairs of the polysilicon layer and the silicon oxide layer.

The upper surfaces of the film stack, including each upper surface of the lower and upper portions, contain less than 200 defects having a particle size of less than 0.5 µm, such as from 0, 2, 5, 8, about 10, about 12, about 15, about 20, about 25, or about 30 defects to about 35, about 40, about 50, about 60, about 70, about 80, about 100, about 120, about 150, about 180, or about 195 defects having a particle size of less than 0.5 µm. For example, the upper surfaces of the film stack, including each upper surface of the lower and upper portions, contain from 0 to less than 200, 0 to about 195, 0 to about 180, 0 to about 150, 0 to about 100, 0 to about 80, 0 to about 60, 0 to about 50, 0 to about 40, 0 to about 30, 0 to about 20, 0 to about 10, about 10 to less than 200, about 10 to about 195, about 10 to about 180, about 10 to about 150, about 10 to about 100, about 10 to about 80, about 10 to about 60, about 10 to about 50, about 10 to about 40, about 10 to about 30, about 10 to about 20, about 20 to less than 200, about 20 to about 195, about 20 to about 180, about 20 to about 150, about 20 to about 100, about 20 to about 80, about 20 to about 60, about 20 to about 50, about 20 to about 40, or about 20 to about 30 defects having a particle size of less than 0.5 µm.

The upper surfaces of the film stack, including each upper surface of the lower and upper portions, contain less than 50 defects having a particle size of greater than 0.5 µm, such as from 0, 1, 2, 3, 5, 8, about 10, about 12, about 15, about 18 or about 20 defects to about 22, about 25, about 30, about 35, about 40, about 45, about 48 defects having a particle size of greater than 0.5 µm. For example, the upper surfaces of the film stack, including each upper surface of the lower and upper portions, contain from 0 to less than 50, 0 to about 48, 0 to about 45, 0 to about 40, 0 to about 35, 0 to about 30, 0 to about 25, 0 to about 20, 0 to about 18, 0 to about 15, 0 to about 12, 0 to about 10, 0 to about 5, about 5 to less than 50, about 5 to about 48, about 5 to about 45, about 5 to about 40, about 5 to about 35, about 5 to about 30, about 5 to about 25, about 5 to about 20, about 5 to about 18, about 5 to about 15, about 5 to about 12, about 5 to about 10, about 10 to less than 50, about 10 to about 48, about 10 to about 45, about 10 to about 40, about 10 to about 35, about 10 to about 30, about 10 to about 25, about 10 to about 20, about 10 to about 18, about 10 to about 15, or about 10 to about 12 defects having a particle size of greater than 0.5 µm.

Embodiments of the present disclosure further relate to any one or more of the following paragraphs:

1. A method of forming a film stack with reduced defects, comprising: positioning a substrate on a substrate support within a processing chamber; sequentially depositing polysilicon layers and silicon oxide layers to produce the film stack on the substrate; supplying a current of greater than 5 ampere (A) to a plasma profile modulator while generating a deposition plasma within the processing chamber; exposing the substrate to the deposition plasma while depositing the polysilicon layers and the silicon oxide layers; and maintaining the processing chamber at a pressure of greater than 2 Torr to about 100 Torr while depositing the polysilicon layers and the silicon oxide layers.

2. A method of forming a film stack with reduced defects, comprising: exposing a processing chamber to a conditioning plasma during a first conditioning process, wherein the processing chamber comprises a faceplate disposed above a substrate support; positioning a substrate on the substrate support within the processing chamber; moving the substrate support to an upper position separated from the faceplate by a narrow spacing, wherein the narrow spacing is about 50 mils to 1,000 mils, as measured between the substrate support and the faceplate; sequentially depositing polysilicon layers and silicon oxide layers to produce a lower portion of the film stack on the substrate; moving the substrate support containing the substrate to a lower position separated from the faceplate by a wide spacing, wherein the wide spacing is greater than 1,000 mils, as measured between the substrate support and the faceplate; maintaining a pressure of about 10 Torr to about 40 Torr within the processing chamber while moving the substrate support containing the substrate to the lower position; removing the substrate comprising the lower portion of the film stack from the processing chamber; exposing the processing chamber to the conditioning plasma during a second conditioning process; positioning the substrate comprising the lower portion of the film stack on the substrate support within the processing chamber; moving the substrate support to the upper position separated from the faceplate by the narrow spacing; sequentially depositing the polysilicon layers and the silicon oxide layers to produce an upper portion of the film stack on the lower portion of the film stack within the processing chamber; moving the substrate support to the lower position separated from the faceplate by the wide spacing; removing the substrate comprising the upper portion of the film stack from the processing chamber; and exposing the processing chamber to the conditioning plasma during a third conditioning process.

3. A method of forming a film stack with reduced defects, comprising: exposing a processing chamber to a conditioning plasma at a power of about 100 watts to about 800 watts during a first conditioning process; positioning a substrate on a substrate support within the processing chamber; sequentially depositing polysilicon layers and silicon oxide layers to produce a lower portion of the film stack on the substrate, wherein depositing the polysilicon layers and the silicon oxide layers further comprises: supplying a current of greater than 5 A to a plasma profile modulator while generating a deposition plasma within the processing chamber; exposing the substrate to the deposition plasma while depositing the polysilicon layers and the silicon oxide layers; and maintaining the processing chamber at a pressure of greater than 2 Torr to about 100 Torr while depositing the polysilicon layers and the silicon oxide layers; removing the substrate comprising the lower portion of the film stack from the processing chamber; exposing the processing chamber to the conditioning plasma at the power of about 100 watts to about 800 watts during a second conditioning process; positioning the substrate comprising the lower portion of the film stack on the substrate support within the processing chamber; sequentially depositing the polysilicon layers and the silicon oxide layers to produce an upper portion of the film stack on the lower portion of the film stack within the processing chamber, wherein depositing the polysilicon layers and the silicon oxide layers further comprises: supplying the current of greater than 5 A to the plasma profile modulator while generating the deposition plasma within the processing chamber; exposing the substrate to the deposition plasma while depositing the polysilicon layers and the silicon oxide layers; and maintaining the processing chamber at the pressure of greater than 2 Torr to about 100 Torr while depositing the polysilicon layers and the silicon oxide layers; removing the substrate comprising the upper portion of the film stack from the processing chamber; and exposing the processing chamber to the conditioning plasma at the power of about 100 watts to about 800 watts during a third conditioning process.

4. The method according to any one of paragraphs 1-3, wherein an upper surface of the film stack comprises less than 200 defects having a particle size of less than 0.5 µm.

5. The method according to any one of paragraphs 1-4, wherein the upper surface of the film stack comprises from 0 defects to about 80 defects having a particle size of less than 0.5 µm.

6. The method according to any one of paragraphs 1-5, wherein an upper surface of the film stack comprises less than 50 defects having a particle size of greater than 0.5 µm.

7. The method according to paragraph 6, wherein the upper surface of the film stack comprises from 0 defects to about 25 defects having a particle size of greater than 0.5 µm.

8. The method according to any one of paragraphs 1-7, further comprising adjusting the deposition plasma with the plasma profile modulator while depositing the polysilicon layers and the silicon oxide layers.

9. The method according to paragraph 8, wherein the processing chamber further comprises a showerhead disposed above the substrate support and an electrically conductive ring disposed between the substrate support and the showerhead, and wherein the plasma profile modulator is coupled to the electrically conductive ring.

10. The method according to any one of paragraphs 1-9, wherein the current to the plasma profile modulator is greater than 8 A to about 20 A when generating the deposition plasma.

11. The method according to any one of paragraphs 1-10, wherein the current to the plasma profile modulator is about 9 A to about 15 A when generating the deposition plasma.

12. The method according to any one of paragraphs 1-11, wherein the deposition plasma is at a power of about 200 watts to about 3,000 watts.

13. The method according to any one of paragraphs 1-12, wherein the deposition plasma is at a power of about 250 watts to about 2,000 watts.

14. The method according to any one of paragraphs 1-13, wherein the processing chamber further comprises a faceplate disposed above the substrate support, and prior to depositing the polysilicon layers and the silicon oxide layers, further comprising moving the substrate support to an upper position separated from the faceplate by a narrow spacing, wherein the narrow spacing is about 50 mils to 1,000 mils, as measured between the substrate support and the faceplate.

15. The method according to paragraph 14, wherein the narrow spacing is about 100 mils to about 500 mils.

16. The method according to paragraph 15, wherein the narrow spacing is about 200 mils to about 300 mils.

17. The method according to any one of paragraphs 1-16, wherein the processing chamber further comprises a faceplate disposed above the substrate support, and subsequent to producing the film stack, further comprising moving the substrate support containing the substrate to a lower position separated from the faceplate by a wide spacing, wherein the wide spacing is greater than 1,000 mils, as measured between the substrate support and the faceplate, and maintaining a pressure of about 3 Torr to about 50 Torr within the processing chamber while moving the substrate support containing the substrate to the lower position.

18. The method according to paragraph 17, wherein the wide spacing is about 2,000 mils to about 10,000 mils.

19. The method according to paragraph 17 or 18, wherein the processing chamber is maintained at a pressure of about 10 Torr to about 40 Torr while moving the substrate support containing the substrate to the lower position.

20. The method according to any one of paragraphs 17-19, wherein the wide spacing is about 3,000 mils to about 5,000 mils.

21. The method according to any one of paragraphs 17-20, wherein the processing chamber is maintained at a pressure of about 15 Torr to about 35 Torr while moving the substrate support containing the substrate to the lower position.

22. The method according to any one of paragraphs 1-21, further comprising igniting a process gas to generate the deposition plasma, wherein the process gas comprises argon, helium, neon, silane, or any combination thereof.

23. The method according to paragraph 22, further comprising introducing the process gas into the processing chamber at a rate of greater than 2 L/min.

24. The method according to paragraph 23, wherein the process gas is introduced into the processing chamber at a rate of about 3 L/min to about 10 L/min.

25. The method according to any one of paragraphs 1-24, wherein the processing chamber is maintained at a pressure of about 3 Torr to about 50 Torr while depositing the polysilicon layers and the silicon oxide layers.

26. The method according to any one of paragraphs 1-25, wherein the processing chamber is maintained at a pressure of about 4 Torr to about 20 Torr while depositing the polysilicon layers and the silicon oxide layers.

27. The method according to any one of paragraphs 1-26, wherein the substrate is heated to a temperature of about 450° C. to about 650° C. while depositing the polysilicon layers and the silicon oxide layers.

28. The method according to any one of paragraphs 1-27, wherein the film stack comprises about 30 pairs to about 100 pairs of the polysilicon layer and the silicon oxide layer.

29. The method according to any one of paragraphs 1-28, wherein the polysilicon layer comprises a p-type doped-polysilicon or an n-type doped-polysilicon.

30. The method according to any one of paragraphs 1-29, wherein the polysilicon layer comprises phosphorus doped-polysilicon.

31. The method according to any one of paragraphs 1-30, further comprising exposing the substrate to a deposition gas comprising a silicon precursor, a phosphorus precursor, and a carrier gas to deposit the polysilicon layer during a plasma-enhanced chemical vapor deposition process.

32. The method according to paragraph 31, wherein the silicon precursor comprises silane and the phosphorus precursor comprises phosphine.

33. The method according to any one of paragraphs 1-32, further comprising exposing the substrate to a deposition gas comprising a silicon precursor, an oxygen precursor, and a carrier gas to deposit the silicon oxide layer during a plasma-enhanced chemical vapor deposition process.

34. The method according to paragraph 33, wherein the silicon precursor comprises tetraethyl orthosilicate and the oxygen precursor comprises nitrous oxide.

35. The method according to any one of paragraphs 1-34, wherein prior to positioning the substrate on the substrate support, further comprising exposing the processing chamber to a conditioning process, comprising: exposing the processing chamber to a conditioning plasma; exposing the processing chamber to a purge gas; and evacuating the processing chamber.

36. The method according to any one of paragraphs 1-35, wherein the conditioning process comprises cleaning and seasoning processes.

37. The method according to any one of paragraphs 1-36, wherein the processing chamber is exposed to the conditioning plasma for about 5 seconds to about 60 seconds and at a power of about 100 watts to about 800 watts.

38. The method according to any one of paragraphs 1-37, wherein the processing chamber is at a pressure of about 5 Torr to about 50 Torr and is exposed to the purge gas having a flow rate of about 5 L/min to about 30 L/min.

39. The method according to paragraph 38, wherein the pressure is about 20 Torr to about 30 Torr and the flow rate is about 15 L/min to about 25 L/min.

40. The method according to paragraph 38, wherein: the processing chamber further comprises a faceplate disposed above the substrate support; the substrate support is disposed at a lower position separated from the faceplate by a wide spacing; and the wide spacing is greater than 1,000 mils, as measured between the substrate support and the faceplate.

41. The method according to paragraph 40, wherein the wide spacing is about 2,000 mils to about 10,000 mils.

42. The method according to paragraph 40, wherein the wide spacing is about 3,000 mils to about 5,000 mils.

43. The method according to any one of paragraphs 1-42, wherein subsequent to producing the film stack on the substrate, further comprising removing the substrate from the processing chamber and exposing the processing chamber to a conditioning process, comprising: exposing the processing chamber to a conditioning plasma; exposing the processing chamber to a purge gas; and evacuating the processing chamber.

44. The method according to paragraph 43, wherein the conditioning process comprises cleaning and seasoning processes.

45. The method according to paragraph 43, wherein the processing chamber is exposed to the conditioning plasma for about 5 seconds to about 60 seconds and at a power of about 100 watts to about 800 watts.

46. The method according to paragraph 43, wherein the processing chamber is at a pressure of about 5 Torr to about 50 Torr and is exposed to the purge gas having a flow rate of about 5 L/min to about 30 L/min; and/or wherein the purge gas comprises nitrogen, argon, helium, or any combination thereof.

47. The method according to paragraph 46, wherein the pressure is about 20 Torr to about 30 Torr and the flow rate is about 15 L/min to about 25 L/min.

48. The method according to paragraph 46, wherein: the processing chamber further comprises a faceplate disposed above the substrate support; the substrate support is disposed at a lower position separated from the faceplate by a wide spacing; and the wide spacing is greater than 1,000 mils, as measured between the substrate support and the faceplate.

49. The method according to paragraph 48, wherein the wide spacing is about 2,000 mils to about 10,000 mils.

50. The method according to paragraph 48, wherein the wide spacing is about 3,000 mils to about 5,000 mils.

51. The method according to any one of paragraphs 1-50, wherein the film stack comprises a lower portion and an upper portion, wherein each of the lower and upper portions comprises the polysilicon layers and the silicon oxide layers, and wherein the lower portion is disposed on the substrate and the upper portion is disposed on the lower portion.

52. The method according to paragraph 51, wherein producing the film stack further comprises: sequentially depositing the polysilicon layers and the silicon oxide layers to produce the lower portion of the film stack; removing the substrate comprising the lower portion of the film stack from the processing chamber; exposing the processing chamber to a conditioning process; placing the substrate comprising the lower portion of the film stack into the processing chamber; and then sequentially depositing the polysilicon layers and the silicon oxide layers to produce the upper portion of the film stack.

53. The method according to paragraph 52, wherein the conditioning process comprises: exposing the processing chamber to a conditioning plasma; exposing the processing chamber to a purge gas; and then evacuating the processing chamber.

54. The method according to any one of paragraphs 1-53, wherein the conditioning process comprises cleaning and seasoning processes.

55. The method according to any one of paragraphs 1-54, wherein the processing chamber is exposed to the conditioning plasma for about 5 seconds to about 60 seconds and at a power of about 100 watts to about 800 watts.

56. The method according to any one of paragraphs 1-55, wherein the processing chamber is at a pressure of about 5 Torr to about 50 Torr and is exposed to the purge gas having a flow rate of about 5 L/min to about 30 L/min; and/or wherein the purge gas comprises nitrogen, argon, helium, or any combination thereof.

57. The method according to paragraph 56, wherein the pressure is about 20 Torr to about 30 Torr and the flow rate is about 15 L/min to about 25 L/min.

58. The method according to paragraph 52, wherein: the processing chamber further comprises a faceplate disposed above the substrate support; the substrate support is disposed at a lower position separated from the faceplate by a wide spacing during the conditioning process; and the wide spacing is greater than 1,000 mils, as measured between the substrate support and the faceplate.

59. The method according to paragraph 58, wherein the wide spacing is about 2,000 mils to about 10,000 mils.

60. The method according to paragraph 58, wherein the wide spacing is about 3,000 mils to about 5,000 mils.

61. The method according to paragraph 52, wherein: the processing chamber further comprises a faceplate disposed above the substrate support; the substrate support is disposed at an upper position separated from the faceplate by a narrow spacing while depositing the polysilicon layers and the silicon oxide layers; and the narrow spacing is about 50 mils to 1,000 mils, as measured between the substrate support and the faceplate.

62. The method according to paragraph 61, wherein the narrow spacing is about 100 mils to about 500 mils.

63. The method according to paragraph 61, wherein the narrow spacing is about 200 mils to about 300 mils.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of forming a film stack with reduced defects, comprising:
    positioning a substrate on a substrate support within a processing chamber;
    sequentially depositing polysilicon layers and silicon oxide layers to produce a lower portion of the film stack on the substrate;
    removing the substrate containing the lower portion of the film stack from the processing chamber;
    exposing the processing chamber to a condition process after removing the substrate containing the lower portion of the film stack from the processing chamber;
    replacing the substrate containing the lower portion of the film stack into the processing chamber;
    supplying a current of greater than 5 ampere (A) to a plasma profile modulator while generating a deposition plasma within the processing chamber;
    exposing the substrate to the deposition plasma while sequentially depositing the polysilicon layers and the silicon oxide layers to produce an upper portion of the film stack; and
    maintaining the processing chamber at a pressure of greater than 2 Torr to about 100 Torr while sequentially depositing the polysilicon layers and the silicon oxide layers.

2. The method of claim 1, wherein an upper surface of the film stack comprises less than 200 defects having a particle size of less than 0.5 µm, and wherein an upper surface of the film stack comprises less than 50 defects having a particle size of greater than 0.5 µm.

3. The method of claim 1, further comprising adjusting the deposition plasma with the plasma profile modulator while depositing the polysilicon layers and the silicon oxide layers, and wherein the current to the plasma profile modulator is greater than 8 A to about 20 A while generating the deposition plasma.

4. The method of claim 1, wherein the current to the plasma profile modulator is about 9 A to about 15 A while generating the deposition plasma, and wherein the deposition plasma is at a power of about 200 watts to about 3,000 watts.

5. The method of claim 1, wherein the processing chamber further comprises a faceplate disposed above the substrate support, and prior to depositing the polysilicon layers and the silicon oxide layers, further comprising moving the substrate support to an upper position separated from the faceplate by a narrow spacing, wherein the narrow spacing is about 50 mils to 1,000 mils, as measured between the substrate support and the faceplate.

6. The method of claim 5, wherein the narrow spacing is about 100 mils to about 500 mils.

7. The method of claim 1, wherein the processing chamber further comprises a faceplate disposed above the substrate support, and subsequent to producing the film stack, further comprising:
    moving the substrate support containing the substrate to a lower position separated from the faceplate by a wide spacing, wherein the wide spacing is greater than 1,000 mils, as measured between the substrate support and the faceplate; and
    maintaining a pressure of about 3 Torr to about 50 Torr within the processing chamber while moving the substrate support containing the substrate to the lower position.

8. The method of claim 7, wherein the wide spacing is about 2,000 mils to about 10,000 mils, and wherein the processing chamber is maintained at a pressure of about 10 Torr to about 40 Torr while moving the substrate support containing the substrate to the lower position.

9. The method of claim 1, further comprising:
    introducing a process gas into the processing chamber at a rate of greater than 2 L/min; and
    igniting the process gas to generate the deposition plasma, wherein the process gas comprises argon, helium, neon, silane, or any combination thereof.

10. The method of claim 1, further comprising:
    maintaining a pressure of about 3 Torr to about 50 Torr within the processing chamber while depositing the polysilicon layers and the silicon oxide layers; and
    heating the substrate to a temperature of about 450° C. to about 650° C. while depositing the polysilicon layers and the silicon oxide layers.

11. The method of claim 1, wherein the film stack comprises about 30 pairs to about 100 pairs of the polysilicon layer and the silicon oxide layer; and wherein the polysilicon layer comprises a p-type doped-polysilicon or an n-type doped-polysilicon.

12. The method of claim 1, wherein the conditioning process comprises:
    exposing the processing chamber to a conditioning plasma;
    exposing the processing chamber to a purge gas; and then evacuating the processing chamber,
    wherein the processing chamber is at a pressure of about 5 Torr to about 50 Torr and is exposed to the purge gas having a flow rate of about 5 L/min to about 30 L/min.

13. The method of claim 1, wherein:
    the processing chamber further comprises a faceplate disposed above the substrate support;
    the substrate support is disposed at a lower position separated from the faceplate by a wide spacing during the conditioning process; and
    the wide spacing is greater than 1,000 mils, as measured between the substrate support and the faceplate.

14. The method of claim 13, wherein the wide spacing is about 2,000 mils to about 10,000 mils.

15. The method of claim 1, wherein:
    the processing chamber further comprises a faceplate disposed above the substrate support;

the substrate support is disposed at an upper position separated from the faceplate by a narrow spacing while depositing the polysilicon layers and the silicon oxide layers; and the narrow spacing is about 50 mils to 1,000 mils, as measured between the substrate support and the faceplate.

16. The method of claim 15, wherein the narrow spacing is about 100 mils to about 500 mils.

17. A method of forming a film stack with reduced defects, comprising:

exposing a processing chamber to a conditioning plasma during a first conditioning process, wherein the processing chamber comprises a faceplate disposed above a substrate support;

positioning a substrate on the substrate support within the processing chamber;

moving the substrate support to an upper position separated from the faceplate by a narrow spacing, wherein the narrow spacing is about 50 mils to 1,000 mils, as measured between the substrate support and the faceplate;

sequentially depositing polysilicon layers and silicon oxide layers to produce a lower portion of the film stack on the substrate;

moving the substrate support containing the substrate to a lower position separated from the faceplate by a wide spacing, wherein the wide spacing is greater than 1,000 mils, as measured between the substrate support and the faceplate;

maintaining a pressure of about 10 Torr to about 40 Torr within the processing chamber while moving the substrate support containing the substrate to the lower position;

removing the substrate containing the lower portion of the film stack from the processing chamber;

exposing the processing chamber to the conditioning plasma during a second conditioning process;

positioning the substrate containing the lower portion of the film stack on the substrate support within the processing chamber;

moving the substrate support to the upper position separated from the faceplate by the narrow spacing;

sequentially depositing the polysilicon layers and the silicon oxide layers to produce an upper portion of the film stack on the lower portion of the film stack within the processing chamber;

moving the substrate support to the lower position separated from the faceplate by the wide spacing;

removing the substrate containing the upper portion of the film stack from the processing chamber; and exposing the processing chamber to the conditioning plasma during a third conditioning process.

18. A method of forming a film stack with reduced defects, comprising:

exposing a processing chamber to a conditioning plasma at a power of about 100 watts to about 800 watts during a first conditioning process;

positioning a substrate on a substrate support within the processing chamber;

sequentially depositing polysilicon layers and silicon oxide layers to produce a lower portion of the film stack on the substrate, wherein depositing the polysilicon layers and the silicon oxide layers further comprises:

supplying a current of greater than 5 ampere (A) to a plasma profile modulator while generating a deposition plasma within the processing chamber;

exposing the substrate to the deposition plasma while depositing the polysilicon layers and the silicon oxide layers; and maintaining the processing chamber at a pressure of greater than 2 Torr to about 100 Torr while depositing the polysilicon layers and the silicon oxide layers;

removing the substrate containing the lower portion of the film stack from the processing chamber;

exposing the processing chamber to the conditioning plasma at the power of about 100 watts to about 800 watts during a second conditioning process;

positioning the substrate containing the lower portion of the film stack on the substrate support within the processing chamber;

sequentially depositing the polysilicon layers and the silicon oxide layers to produce an upper portion of the film stack on the lower portion of the film stack within the processing chamber, wherein depositing the polysilicon layers and the silicon oxide layers further comprises:

supplying the current of greater than 5 A to the plasma profile modulator while generating the deposition plasma within the processing chamber;

exposing the substrate to the deposition plasma while depositing the polysilicon layers and the silicon oxide layers; and maintaining the processing chamber at the pressure of greater than 2 Torr to about 100 Torr while depositing the polysilicon layers and the silicon oxide layers;

removing the substrate containing the upper portion of the film stack from the processing chamber; and exposing the processing chamber to the conditioning plasma at the power of about 100 watts to about 800 watts during a third conditioning process.

* * * * *